(12) United States Patent
Fritzsche et al.

(10) Patent No.: US 8,862,493 B2
(45) Date of Patent: Oct. 14, 2014

(54) SIMULATOR WITH USER INTERFACE INDICATING PARAMETER CERTAINTY

(75) Inventors: Mathias Fritzsche, Belfast (GB); Roger Kilian-Kehr, Darmstadt (DE); Wasif Gilani, Belfast (GB); Ralph Gerbig, Worms (DE)

(73) Assignee: SAP AG, Walldorf (DE)

( * ) Notice: Subject to any disclaimer, the term of this patent is extended or adjusted under 35 U.S.C. 154(b) by 716 days.

(21) Appl. No.: 12/550,507

(22) Filed: Aug. 31, 2009

(65) Prior Publication Data
US 2011/0054865 A1 Mar. 3, 2011

(51) Int. Cl.
| | |
|---|---|
| *G06Q 10/00* | (2012.01) |
| *G06Q 10/04* | (2012.01) |
| *G06Q 10/06* | (2012.01) |
| *G06Q 10/10* | (2012.01) |
| *G06G 7/48* | (2006.01) |
| *G06G 7/62* | (2006.01) |
| *G06F 17/50* | (2006.01) |

(52) U.S. Cl.
CPC .......... *G06Q 10/0637* (2013.01); *G06Q 10/04* (2013.01); *G05B 2219/32216* (2013.01); *G06F 17/5009* (2013.01); *G06Q 10/067* (2013.01); *G05B 2219/32017* (2013.01); *G06Q 10/10* (2013.01); *G06Q 10/0635* (2013.01); *G06Q 10/0633* (2013.01)
USPC ........ 705/7.36; 705/348; 705/7.27; 705/7.28; 703/6; 703/7; 703/17

(58) Field of Classification Search
CPC ........... G06Q 10/0637; G06Q 10/067; G06Q 10/0633; G06Q 10/04; G06Q 10/0635; G06F 17/5009; G05B 2219/32017; G05B 2219/32216
USPC .......... 705/7.36, 348, 7.27, 7.28; 703/6, 7, 17
See application file for complete search history.

(56) References Cited

U.S. PATENT DOCUMENTS

| | | | |
|---|---|---|---|
| 8,145,468 B2 | 3/2012 | Fritzsche et al. | |
| 8,276,112 B2 | 9/2012 | Fritzsche et al. | |
| 2003/0187717 A1* | 10/2003 | Crites et al. ................ | 705/10 |
| 2003/0233273 A1* | 12/2003 | Jin et al. ..................... | 705/11 |
| 2004/0059561 A1* | 3/2004 | Gluhovsky ................ | 703/22 |
| 2004/0133876 A1* | 7/2004 | Sproule ..................... | 717/105 |
| 2005/0096950 A1* | 5/2005 | Caplan et al. ............. | 705/7 |
| 2005/0108084 A1* | 5/2005 | Ramamoorti et al. ..... | 705/10 |

(Continued)

OTHER PUBLICATIONS

Fritzsche et. al., "Towards Utilizing Model-Driven Engineering of Composite Applications for Business Performance Analysis," Jun. 9-13, 2008 Proceedings at 4th European Conference in Model Driven Architecture—Foundations and Applications, pp. 369-380.*

(Continued)

*Primary Examiner* — Justin M Pats
*Assistant Examiner* — Ivan R Goldberg
(74) *Attorney, Agent, or Firm* — Brake Hughes Bellermann LLP

(57) ABSTRACT

In a computer-implemented process modeling and simulating environment, an analyzer receives a process model with parameters in combination with data from previous or planned process performances. An analyzer receives a simulation target from a user, calculates evaluation results that represent the influence of the parameters in view of the simulation target, and presents the evaluation results as indicators to the user. Upon receiving modifications to the performance data, the process is simulated with modified performance data. Alternatively, the evaluation results are converted to computer instructions to automatically modify the process parameters.

18 Claims, 12 Drawing Sheets

(56) References Cited

U.S. PATENT DOCUMENTS

| | | | | |
|---|---|---|---|---|
| 2006/0053039 | A1* | 3/2006 | Gamarnik et al. | 705/7 |
| 2006/0106637 | A1* | 5/2006 | Johnson et al. | 705/1 |
| 2006/0111931 | A1* | 5/2006 | Johnson et al. | 705/8 |
| 2006/0184564 | A1* | 8/2006 | Castellanos et al. | 707/102 |
| 2006/0224439 | A1* | 10/2006 | Smith et al. | 705/10 |
| 2007/0250335 | A1* | 10/2007 | Hodges et al. | 705/1 |
| 2007/0265900 | A1* | 11/2007 | Moore | 705/8 |
| 2007/0282581 | A1* | 12/2007 | Mangino et al. | 703/6 |
| 2008/0288433 | A1* | 11/2008 | Nores et al. | 706/47 |
| 2009/0132562 | A1* | 5/2009 | Mehr et al. | 707/100 |
| 2009/0319469 | A1* | 12/2009 | Lesser et al. | 707/1 |

OTHER PUBLICATIONS

Gilani et al., "Towards Performance Related Decision Support for Model Driven Engineering of Enterprise SOA applications," Apr. 4, 2008, Engineering of Computer Based Systems, 15th Annual IEEE Conference and Workshop, pp. 57-65.*

Johannes et al., "Putting Performance Engineering into Model-Driven Engineering: Model-Driven Performance Engineering," MoDeVVA '07 at the Model Driven Engineering Languages and Systems, ISBN-2-7261-12943 3, 2007, pp. 77-87.*

Holosofx, "Continuous Business Process Management with Holosofx BPM Suite and IBM MQSeries Workflow," ibm.com/redbooks, May 2002, p. 1-534.*

Fritzsche, "Towards Utilizing Model-Driven Engineering of Composite Applications for Business Performance Analysis," Jun. 9-13, 2008 Proceedings at 4th European Conference in Model Driven Architecture—Foundations and Applications, pp. 369-380.*

Gilani, "Towards Performance Related Decision Support for Model Driven Engineering of Enterprise SOA applications," Apr. 4, 2008, Engineering of Computer Based Systems, 15th Annual IEEE Conference and Workshop, pp. 57-65.*

Ayyub, "Uncertainty Modeling and Analysis in Engineering and the Sciences," 2006, Taylor & Francis Group, pp. 23, 131-132, 156, 173, 182-183, 268-270, 328, 330, 340, 341.*

Zouaoui, "Accounting for parameter uncertainty in simulation input modeling," 2003, IEE Transactions vol. 35, pp. 781-792.*

Ayyub, "Uncertainty Modeling and Analysis in Engineering and the Sciences," 2006, Taylor & Francis Group, pp. 1-343.*

Han, "Two-stage process analysis using the process-based performance measurement framework and business process simulation," 2009, Expert Systems with Applications, vol. 36, pp. 7080-7086.*

Fritzsche, et al, "Applying megamodelling to model driven performance engineering", ECBS'09, 2009, 10 pages.

Fritzsche, et al, "Extending BPM Environments of your choice with performance related Decision Support", BPM '09, 2009, pp. 97-112.

Pang, et al, "Approaches to uncertainty visualization", Journal: The Visual Computer, vol. 13, 1996, 24 pages.

Fritzsche, et al, "Putting Performance Engineering into Model-Driven Engineering: Model-Driven Performance Engineering", MODELS'07 Revised Selected Papers, LNCS 5002, 2007, pp. 164-175.

OMG, "Business Process Modeling Notation Specification", Final Adopted Specification, 2006, 308 pages.

Snabe, et al, Business process management: The SAP Roadmap. SAP Press, 2008, 21 pages.

"ARIS Process Performance Manager", http://www.ids-scheer.be/en/ARIS/, Mar. 2011, 47 pages.

Fritzsche, et al, "Application of tracing techniques in model driven performance engineering", ECMDA—FA 4th workshop on traceability, 2008, pp. 111-120.

Fritzsche, et al, "Systematic usage of embedded modelling languages in model transformation chains", International Conference on Software Language Engineering with MoDELS, vol. 5452, 2008, pp. 134-150.

Aktaran-Kalayci, et al, "Confidence interval estimation using linear combinations of overlapping variance estimators", Proceedings of the 2007 Winter Simulation Conference, 2007, pp. 448-454.

Litko, "Sensitivity analysis for robust parameter design experiments," WSC '05, 2005, pp. 2020-2025.

Kleijnen, et al, "Experimental Designs for Sensitivity Analysis of Simulation Models", EUROSIM, Jun. 2001, 8 pages.

"Geer mountain software corp", http://www.geerms.com/index.htm, 2 pages.

Ng, et al, "Reducing input parameter uncertainty for simulations", Proceedings of the 2001 Winter Simulation Conference, 2001, pp. 364-371.

Chick, "Bayesian analysis for simulation input and output", WSC'97, 1997, pp. 253-260.

Chick, et al, "Simulation input analysis: joint criterion for factor identification and parameter estimation", Proceedings of the 2002 Winter Simulation Conference, 2002, pp. 400-406.

Fritzsche, et al, "Towards utilizing model-driven engineering of composite applications for business performance analysis", 4th ECMDAFA, LNCS 5095, 2008, 12 pages.

Fritzsche, et al, "Towards performance related decision support for model driven engineering of Enterprise SOA applications", Proceedings of the 15th Annual IEEE International Conference and Workshop on the Engineering of Computer Based Systems, 2008, pp. 57-65.

* cited by examiner

SIMULATOR WITH USER INTERFACE INDICATING PARAMETER CERTAINTY

TECHNICAL FIELD

The description generally relates to processing process models by computers, and more in particular to optimizing such models.

BACKGROUND

The efficiency of business processes in an enterprise is important for its profitability and success. Enterprises are continuously optimizing the processes and adapting them to market environments. More in general that approach is applicable for processes in other organizations as well.

Data that relates to processes has large volumes and shows high complexity. Therefore, the usage of computers is mandatory. However, human experts in business processes are not necessarily experts in operating the computers.

SUMMARY

According to one general aspect, a computer program product is configured to cause a data processing apparatus to perform a method, including receiving a model of a process having process parameters in combination with performance data; calculating certainty level indicators representing the influence of the parameters to simulation; presenting the indicators to a user and receiving modifications to the performance data; and simulating the execution of the process with modified performance data.

According to a further aspect, a computer program product is configured to cause a data processing apparatus to perform a method, including receiving a model of a process having process parameters in combination with performance data; calculating instructions that represent the influence of the parameters to simulation; applying the instructions to modify the performance data; and simulating the execution of the process with modified performance data.

According to a further aspect, in a computer-implemented process modeling and simulating environment, an analyzer receives a process model with parameters in combination with data from previous or planned process performances. The analyzer receives a simulation target from a user, calculates evaluation results that represent the influence of the parameters in view of the simulation target, and presents the evaluation results as indicators to the user. Upon receiving modifications to the performance data, the process is simulated with modified performance data. Alternatively, the evaluation results are converted to computer instructions to automatically modify the process parameters.

According to a further aspect, a user-interface for a computer is adapted to simulate processes, the user interface with a first portion to visualize a process model to be simulated with parameters, a second portion to receive a target for simulation, and a third portion to visualize indicators for a certainty of using the parameters in a simulation according to the selected target.

According to a further aspect, a method for operating a computer includes receiving a model of a process with process parameters in combination with performance data; calculating certainty level indicators representing the influence of the parameters to simulation; presenting the indicators to a user and receiving modifications to the performance data; and simulating the execution of the process with modified performance data.

According to a further aspect, a method for operating a computer includes receiving a model of a process with process parameters in combination with performance data; calculating instructions that represent the influence of the parameters to a simulation; applying the instructions to modify the performance data; and simulating the execution of the process with modified performance data.

According to a further aspect, a system includes instructions recorded on a computer readable medium, and the system includes an analyzer configured to receive a model of a process with process parameters in combination with performance data; calculate certainty level indicators representing the influence of the parameters to simulation; present the indicators to a user and receive modifications to the performance data; and simulate the execution of the process with modified performance data.

According to a further aspect, a system includes instructions recorded on a computer readable medium, and the system includes an analyzer configured to receive a model of a process with process parameters in combination with performance data; calculate instructions that represent the influence of the parameters to a simulation; apply the instructions to modify the performance data; and simulate the execution of the process with modified performance data.

The details of one of more implementations are set forth in the accompanying drawings and the description below. Other features will be apparent from the description and drawings, and from the claims.

DETAILED DESCRIPTION

The following description uses business processes as an example; those of skill in the art can apply the teachings herein to processes in general.

Figure 1:
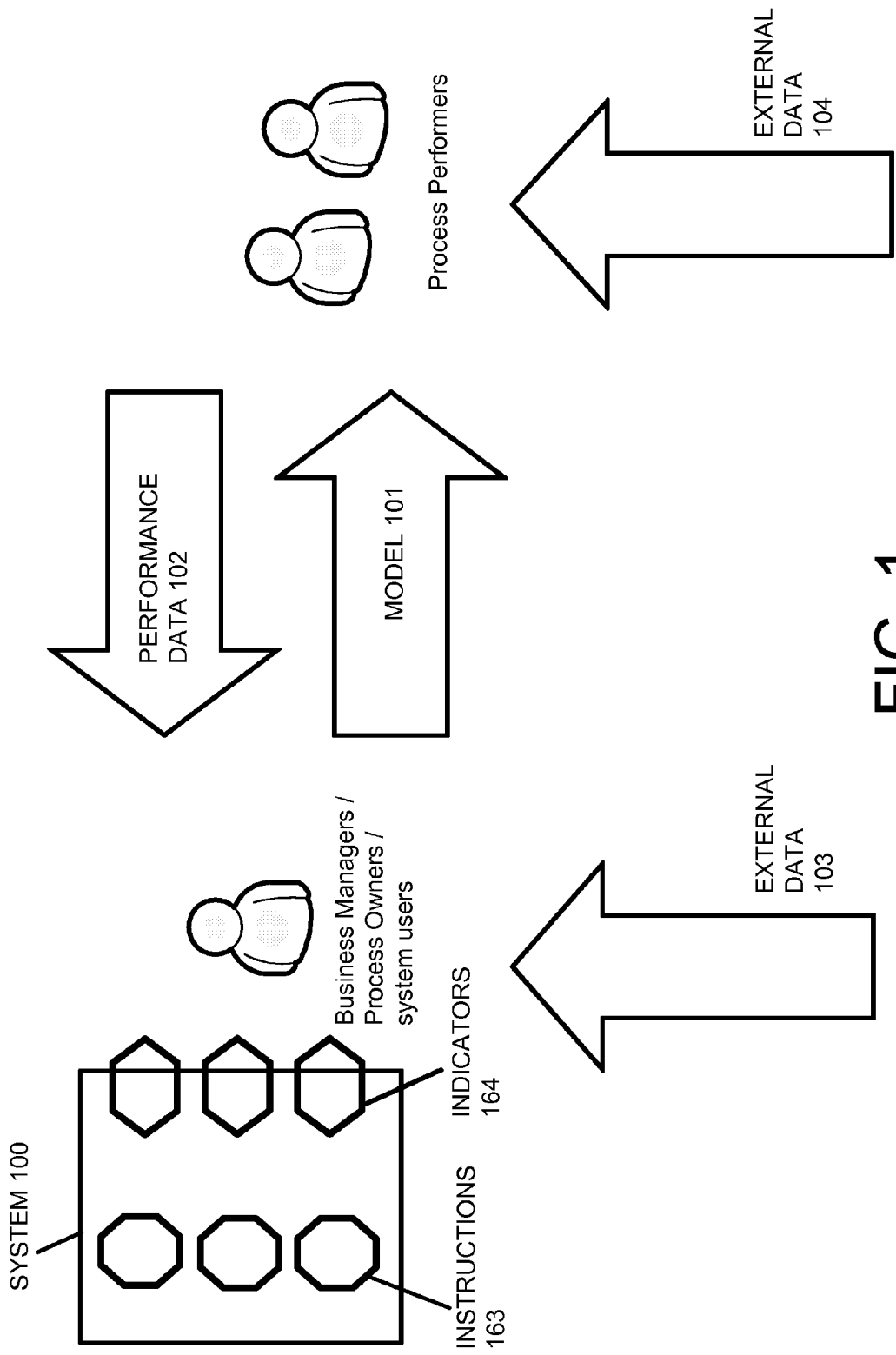
FIG. 1 is a simplified overview of an organization that benefits from a system in an example embodiment.

FIG. 1 is a simplified overview of an organization that benefits from a system 100 in an example embodiment. As illustrated on the left side, business managers configure and define business processes. The managers are also called process owners. As illustrated on the right side, process performers actually execute the process in day-to-day operations. The distinction between both sides is convenient for explanation, but not limiting. Process owners and performers can be seen as roles, that could also be performed by the same person.

Terms like "owner" and "performer" suggest activities by humans, this is convenient for explanation but not limiting. Once set up by humans, processes can be performed by machines or a combination of humans and machines, and it is within the scope of the inventive embodiment that system 100 supports process improvement in machine-performed processes as well.

Returning to the figure, there is communication between both sides: the process owners (managers) provide descriptions (or so-called models) to the performers (arrow 101), the models include information, such as the control flow and activities of the process. The performers return performance data back to the managers (arrow 102), such as information about resources that had been spent for the activities. Arrow 103 and 104 illustrates data usually from outside the process ("external data"), data that is not included in 101 and 102. Data 103 goes to the process owners (managers) and—optionally—data 104 goes to the process performers.

In many settings, the accuracy of model and data is of paramount importance for running processes efficiently. In an example embodiment, computer system 100 assists the managers to obtain efficient process models by evaluating the quality of data (cf. data arrows 102, 103, 104) that goes into the model. The managers are the users of system 100. Since business managers are not necessarily computer experts, system 100 provides an easy-to-use user interface (UI). In FIG. 1, and in other figures, octagons and hexagons symbolize that system 100 provides evaluation results.

In a first embodiment, system 100 uses evaluation results presented to its UI by indicators 164 (hexagon symbols). In a second embodiment, system 100 uses evaluation results that are computer-readable instructions 163 (octagon symbols). The evaluation results—indicators 164 or instructions 163 alone or in combination—are used to modify data (102, 103, 104), by for example, collecting more data, disregarding data that is not significant, selecting data for further processing, and so on. In case of the indicators, the user considers the indicators as recommendation and triggers modifications manually; and in case of the instructions, the system triggers modifications to the mentioned machine-performed processes.

The following description illustrates exemplary embodiments of the invention by referring to an exemplary enterprise that protects inventions by filing many patent applications per year. In that enterprise, the managers (left side) provide a model (101) that describes the patenting process. In the example, data relates to resource spending (e.g., costs and time per patent). Inventors, attorneys and support staff (right side, collectively referred to as "attorneys") perform the patenting process. The attorneys also feed back data (102) to fine-tune the process. A patent office is participating in the process from outside the enterprise. For example, the patent office provides data 103 to the managers (e.g., indicating fees that are monetary resources) and the patent office communicates (data 104) with the process performers (e.g., by sending office actions to the attorneys).

Figure 2:
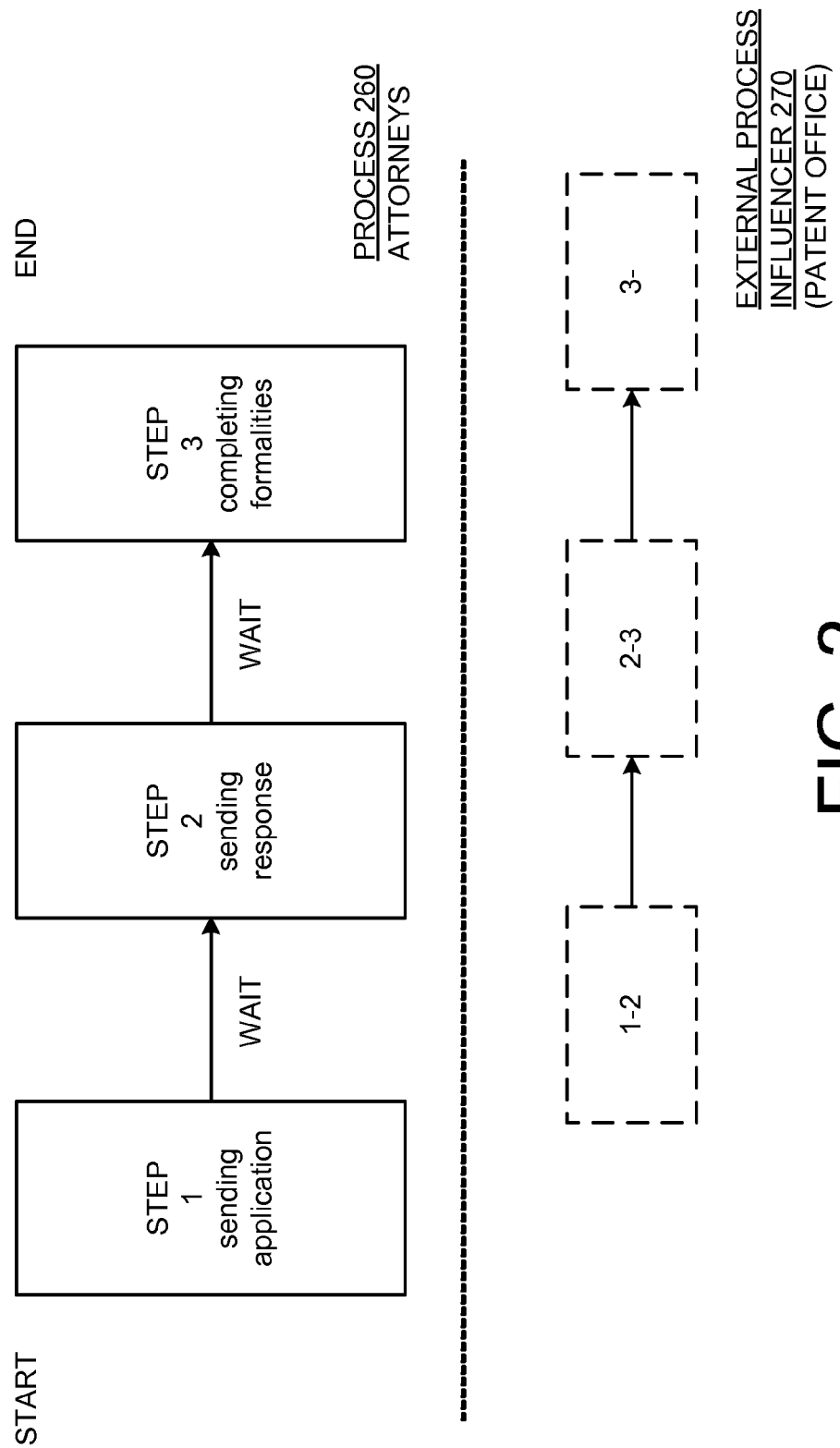
FIG. 2 is a process diagram that illustrates an exemplary process.

FIG. 2 is a process diagram that illustrates that exemplary process 260, by showing a graph that represents the model 101 (cf. FIG. 1). In a first step, the attorney sends a patent application to the patent office. The attorney then waits—usually a couple of months—and receives feedback from the patent office (a so-called office action). In a second step, the attorney sends a response to the patent office. The attorney then waits again—usually for a shorter time—and receives a notice of allowance from the patent office. In a third step, the attorney completes formalities, such as to pay a so-called issue fee to the patent office.

Turning to the figure, plain rectangles symbolize steps by the process performers (e.g., the attorneys). In the example, process 260 starts at step 1 (e.g., sending the application), continues at step 2 (e.g., sending the response), and ends with step 3 (e.g., completing formalities). Arrows symbolize relations between the steps. In the example of the figure, the arrows illustrate the time progress by going from left to right. Looking from the attorneys' perspective, very much simplified, the process appears as a sequence of steps (or actions) that they perform one after another. The time between the steps appears as waiting time. Executing the process once (in the example for one patent application turning into a patent) is referred to as instance. Process 260 is shown as a sequence of steps and thereby gives an overall theoretical framework for a process that becomes more complicated when actually executed (by the performers).

As illustrated below by a dashed line, dashed boxes and arrows, there are external influencers 270 to the process 260. In other words, the patent office executes a parallel process that is complementary to process 260. The office prepares feedback (between steps 1 and 2), prepares the notice of allowance (between step 2 and 3), and grants the patent (following step 3). Feedback, the notices of allowances and especially the timing of such patent office activities belongs to external data (cf. data 104). The managers (that define model 101) consider the complementary process; but the managers also know that some information is missing. For example, it is sure (for the managers and for the attorneys) that feedback from the patent office will arrive for all applications, but it is difficult to estimate when the feedback will arrive: it could take the mentioned couple of months or it could take a year or more. Modeling that complementary process 270 is optional, and not required. Complementary process 270 adds complexity and uncertainty in some aspects of main process 260.

Figure 3:
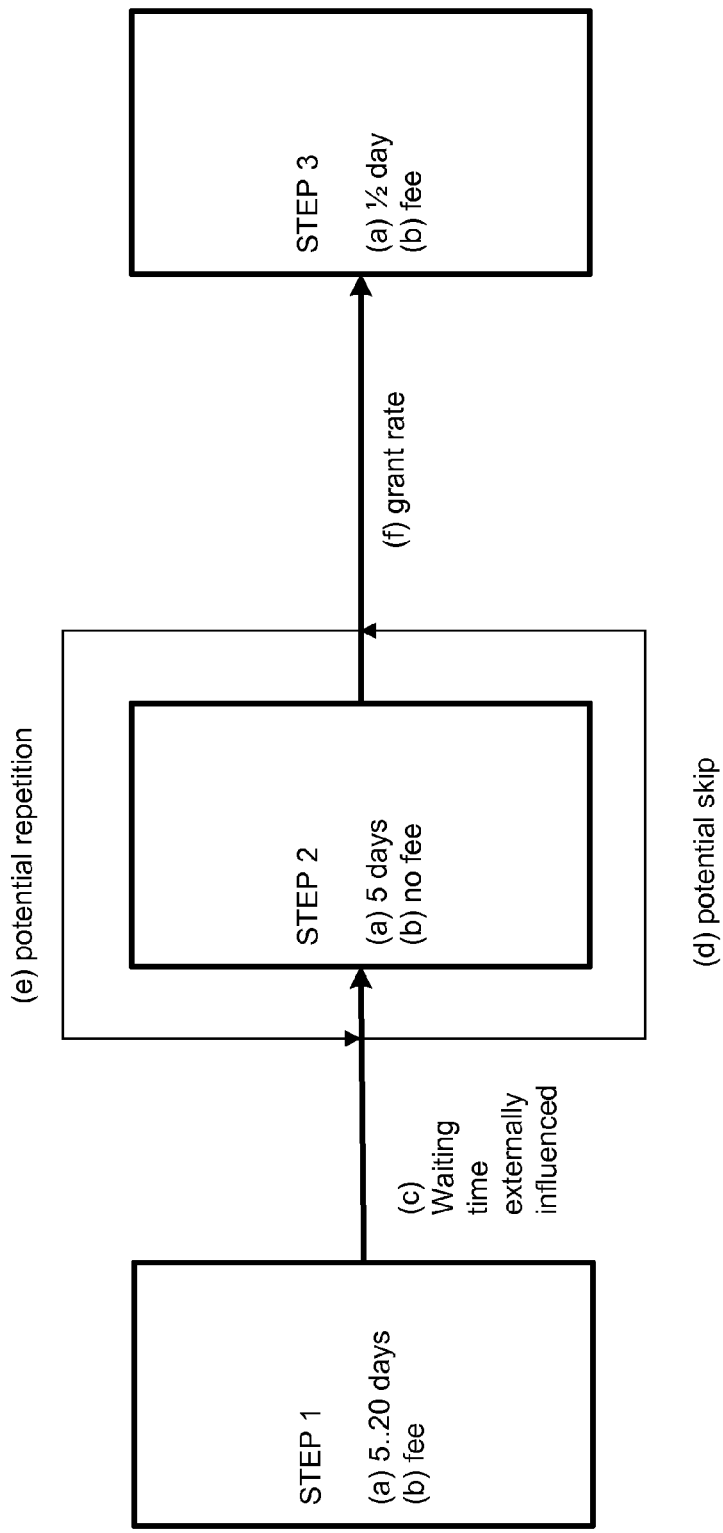
FIG. 3 is the process diagram with annotated process parameters.

FIG. 3 is the process diagram with annotated process parameters (a) to (f), such as step resources, variations in the step sequences, indication of waiting times, etc. The parameters can come from various sources, for example, the managers set up the sequence, and the attorneys contribute data from experience (cf. FIG. 1, data 102, such as the waiting time that results from the complementary process).

Execution of process steps requires resources (a, b), in the example of the patent process, step 1 might require between 5 and 20 days of work for one attorney, plus the payment of a fee; step 2 might require 5 days of work but no fee payment; and step 3 might require half a day, but again a fee payment.

Execution of the process depends on other circumstances. Staying with the patent process, or rather the complementary process at the patent office, (c) the times between the steps (e.g., waiting times for the attorney) likely depend on the workload of the patent office, but the attorney has limited options to speed up the work of the office.

Further, process execution may vary. In the example, the feedback from the patent office might be favorable so that the attorney can skip (d) the response (step 2) by immediately completing formalities (step 3). Step 2 might need to be repeated (e). Or, as a result of repeated feedback/responses cycles (step 2), the process might stop so that a patent is not granted (f). Since such patent processes may be executed for hundreds of thousands of inventions each year by a particular patent office, statistical probabilities can be calculated, for example, the so-called grant rate indicates a probability of a transitions from step 2 to step 3. Patent offices publish grant rates on a yearly basis so that parameter (f) is available for consideration (data 103, 104).

To summarize, such parameters describe the details of the process; in the example of the patent process, parameters are (a) working time of the attorney and (b) fee amounts; (c) waiting time between steps; and (d)(e)(f) step transition probabilities.

As mentioned, efficiency of business processes in an enterprise is important; to stay with the example, some enterprises may trigger the patent processes 100 times a year so that at any given day, the enterprise executes all of the steps at the same time for different inventions. Process descriptions with parameters are useful for planning or other purposes. For example, for enterprises with patenting activities, it is desirable to estimate the overall working time or fee amounts, or the number of patents to be expected. In other words, the managers of the enterprise apply a target number (e.g., the mentioned 100) to the instance (i.e., process for a single patent), apply parameters and seek to obtain the overall estimation.

However, the accuracy of the parameters varies: for example, the patent office regularly publishes fees (b) and average grant rates (f), but the office does not guarantee a schedule for sending out the responses (c). Further, data for working times (a) might not be available. Step transition probabilities (d)(e)(f) also depend on the content of the patent application (that is not subject to the model).

This exemplary process has only few parameters but it is already complicated and complex. As mentioned above, managers can benefit from system 100 (cf. FIG. 1). For example, system 100 allows the user (i.e. the manager) to set up the process steps by composing a graphical representation of the process directly into the computer. For example, the user could drag and drop symbols from a repository (of pre-defined building blocks) and compose a model graph (cf. the example, in FIGS. 2, 3).

The computer recognizes the symbols (e.g., the rectangles and arrows of FIG. 2) and converts the graph, for example, into a list in computer-readable language. For example, the description can have the form of a standardized Business Process Description Language. Graphics and language can be interchangeable.

Entering the parameters is possible, for example, by interacting with the user to annotate the process steps or to import data directly into the system. Example embodiments will help the user to deal with large data volumes, complexity, and resulting process uncertainties. To explain that embodiment(s), the description will shortly look at lifecycle and simulation; these are aspects of process modeling that are used in system 100.

Figure 4:
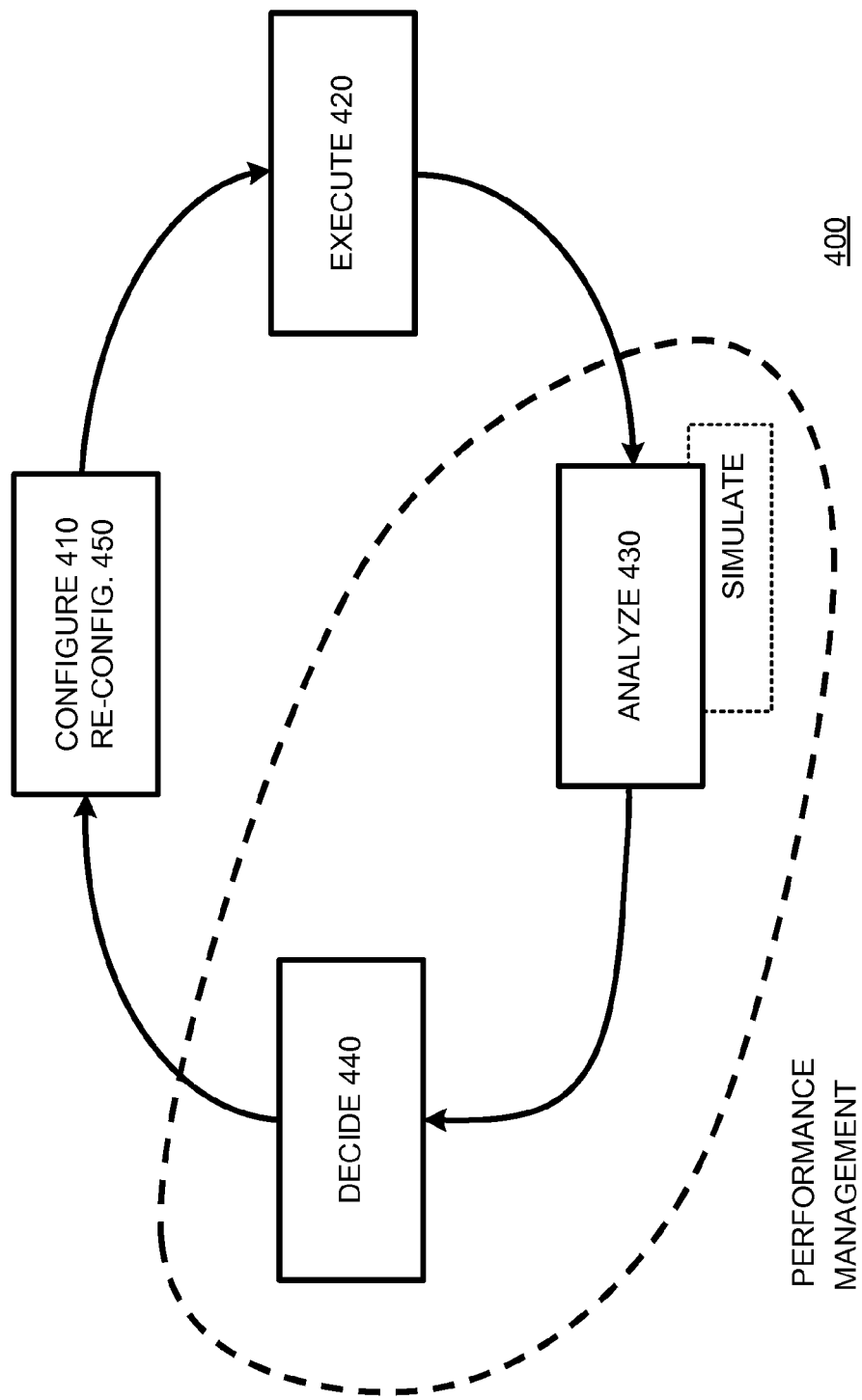
FIG. 4 is a process diagram to illustrate basic principles of a process lifecycle.

FIG. 4 is a process diagram to illustrate basic principles of a process lifecycle 400. Processes have lifecycles with, e.g., consecutive phases like configuring 410, executing 420, analyzing 430, deciding 440, and re-configuring 450 (to close the loop).

In an example embodiment, the dashed area illustrates that system 100 (cf. FIG. 1) is of benefit for the manager in analyzing 430 and deciding 440. In other words, process modeling turns into computer-supported performance management (or Model Driven Performance Engineering, MDPE).

Computer support is possible for all phases. In the example, looking at the process performer side (cf. FIG. 1, right side) patent management and/or finance systems usually track data, (arrow 102, data that goes into system 100), and to some extent patent management systems include model descriptions (101).

In the example, configuring the process includes identifying the sequence of steps. In this case, the managers describe that the patents process has 3 basic steps and they set up initial parameters. For example, the process can be set up with the following initial parameter set: parameter (a) at 10 days for step 1, 5 days for step 2, or 0.5 days for step 3; parameter (b) the fees as published by the patent office (external data 103), parameter (c) assumed as 6 month waiting times, and parameter (d) assuming all steps to be performed one time.

Executing includes that the process performers (cf. right side) run the process at least once, or in the enterprise many times a year. Analyzing includes collecting and evaluating data (cf. arrows 102, 103, 104 in FIG. 1), and presenting potential inaccuracies to the manager user. For example, the process performer (attorneys) may report (data 102, 104) that (parameter a) it takes 12 days for step 1, 4 days for step 2 and 0.5 days for step 3, or that (parameter e) step 2 is repeated in 90 percent of the applications. Or, system 100 may query the patent office to have the fees up to date on record (data 103) to get the parameter (b).

As indicated by a dashed box labeled "simulate", based on evaluation results, data can be modified and then applied to simulate process execution. In other words, in an example embodiment, system 100 makes uncertainties resulting from process parameter variations visible to the user, so that the user can apply modifications.

Deciding includes supporting the manager in modifying the process model, so that the loop is closed and the process runs with improved settings.

Figure 5:
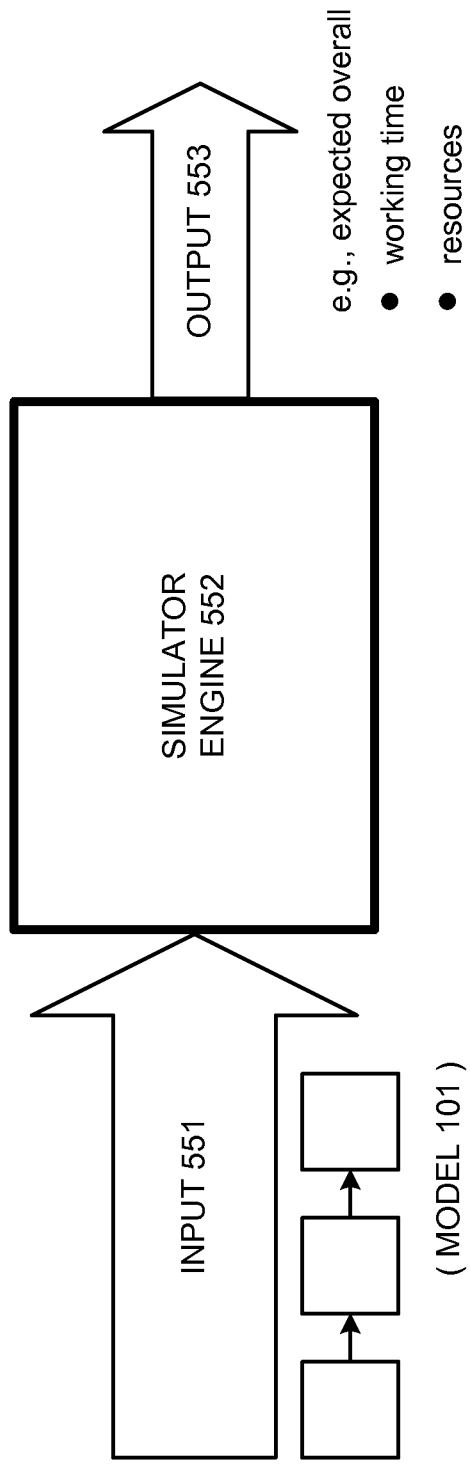
FIG. 5 is a simplified block diagram of a simulator that can be implemented into the system.

FIG. 5 is a simplified block diagram of a simulator 500 that—in an example embodiment—is implemented into system 100. The simulator has—for purposes of explanation very much simplified—an input 551 for the parameters, an engine 552 that uses process definitions (i.e. computer-descriptions of the process, the model), and an output 553 to provide simulated performance data, or more in general, to predict the performance.

In all lifecycle phases (cf. FIG. 4), computers can be used to simulate, for example, the execution of a process under re-configured conditions, without actually executing the process. Simulation will address questions from the managers, for example: Can the available persons in the enterprise handle future business growth? This can be simulated with an increased number of process instances to be executed in a given time frame. In the example, can more inventions be protected by patents? This can be simulated with an increased number of patent applications. Would it be sufficient to train the process performers (e.g., attorneys) to achieve certain business goals? This can be simulated by decreasing the processing time for some process steps, for example, by modifying the working times in steps 1, 2, or 3 (parameter a).

For the example with the exemplary process, output 553 could be the expected overall values, for working time (calculated from parameter a), fees (from parameter b), or other resource spending. The output could also be an indication of a date where the completion of the process can be expected (from parameters c, e, f). More in general, simulation seeks to obtain (OUTPUT) data that describe process performance that can be expected in case of executing the process, for given (INPUT) process parameters (that are usually related to the process steps, like the time for a step).

However, it will be understand that—simplified—incorrect data at the input would lead to incorrect results at the output (garbage-in-garbage-out GIGO principle). Thus, simulation generally depends on the quality of the input data. The parameters can be actual or historic data, for example, the time to process a step can be based on previous process executions (in the example, data 102 provided by the attorneys). Data might not be sufficient, in other words, statistical samples sizes are too low, for example, step 3 has not been executed for a statistically sufficient number of patent applications. The parameters can be estimations or assumptions, for example, this is especially important for simulations before executing (where the process had not yet been executed, cf. FIG. 3 phase configuring). In the example, the parameters can be business goals that are given be management, so-called "plan data", as mentioned, to run a simulation for 100 patent application per year.

With the exception of the business goals, the input parameters are potentially incorrect or not suitable for simulation. In the example, the only exact parameters are the fees (in steps 1 and 3) because the fees are published by the patent office.

The management user is—especially for the actual data—not necessarily the person who has collected the data (e.g. data may be entered by other persons at operational level, or entered from process execution records, or business logs). So the user may not be able to judge if the actual data is correct or not. In the example, the manager receives the data from the attorneys or from the patent management system.

At the simulation engine itself, looking at the business process that is simulated, the simulation uses the process model (101, in the above mentioned computer descriptions) that could be very complex with multiple steps (more then 3), and multiple process variations (cf. FIG. 3, repeating or skipping steps, bifurcations etc.).

The management user—although being an expert in management—is potentially not computer-skilled enough to understand that complexity. The management user might have introduced incorrect step/process definitions, so that the process descriptions that are available to the computer might not match reality. For example, the very first definition of the patent process with a one-time only performance of step 2 is likely to be insufficient.

At the simulation output side (cf. FIG. 5), the simulation may therefore provide process performance data that would not fit reality if the process is executed. In other words, the data from actual process execution (after simulation) would not meet expectations set by the simulation. It is very complicated for the management user to estimate whether the simulation can be trusted or not, particularly since, although called "management users" at input, engine, and output, the user could be a different person with different skill sets than that needed, e.g., to determine a trust level of the simulation.

To summarize at least some of the constraints, there may be questions of data quality (especially at the simulation input), complexity (especially important at the engine), and trust (especially at the output). Theses and other constraints contribute to uncertainties of the simulation.

Particularly where a fully automated simulation is not possible, uncertainties should be pointed out to the user, so that appropriate action may be taken. Uncertainties are detected and visualized by an embodiment of the invention, such as the system of FIG. 1. The system evaluates data and provides indicators and/or instructions. The description continues with more detail.

Figure 6:
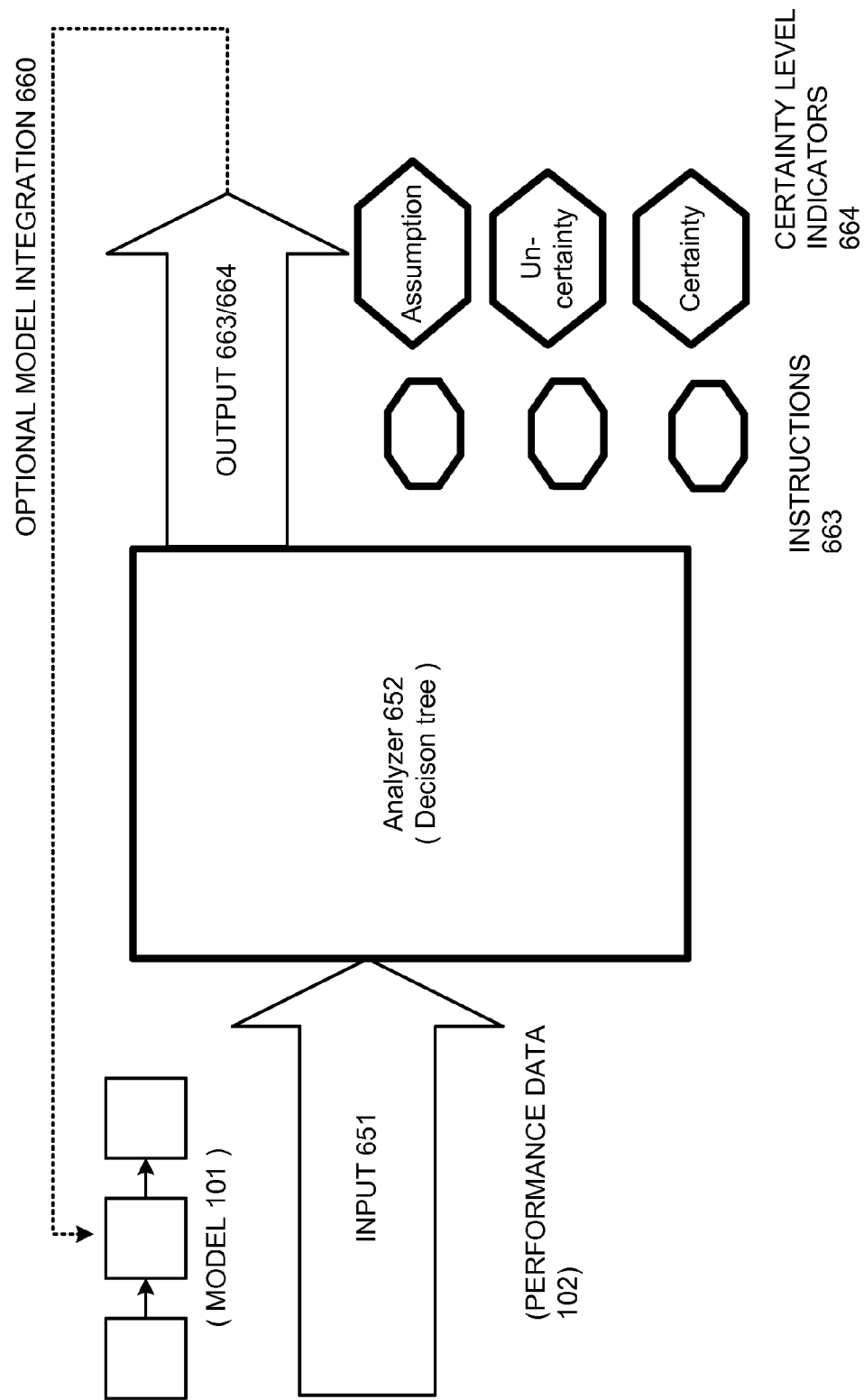
FIG. 6 is a simplified block diagram of an analyzer that is part of the system.

FIG. 6 is a simplified block diagram of an analyzer 652 that is part of the system (cf. 100 in FIG. 1) that has input 651 to receive model 101 and performance data 102. It has output 653 with certainty level indicators 664 relating to the model and to the performance data and that indicate a level of certainty (cf. the hexagons in FIG. 1). Instead of indicators 664, the output can provide machine-readable instructions 663.

As illustrated by a dashed line 660 (from the output to the input), optionally, the level indicators can be related visually to the model, so that the user can select an indicator and see the relation of that indicator to the model, or vice versa, select a component of the model and see the corresponding indicator.

Figure 7:
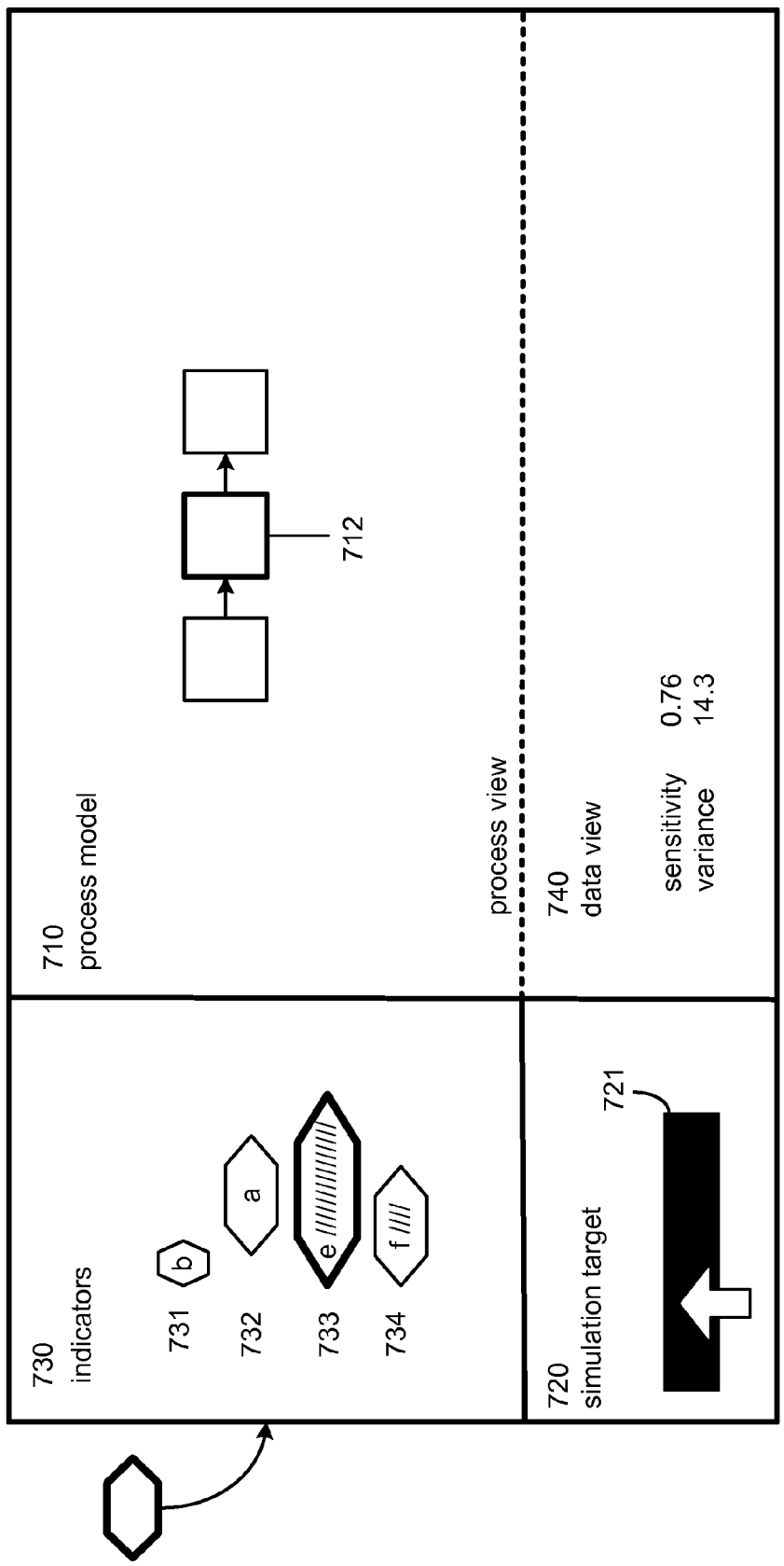
FIG. 7 is a simplified view of a computer-implemented user-interface, with portions to visualize the process model, to receive a simulation target, and to visualize certainty indicators.

FIG. 7 is a simplified view of a computer-implemented user-interface 700, with first portion 710 to visualize a process model adapted to be simulated with parameters, a second portion 720 to receive a target for simulation, and a third portion 730 to visualize indicators for a certainty of using the parameters in a simulation with the selected target. The arrangement of the portions on the screen is not relevant, those of skill in the art can arrange the portions differently.

In the embodiment, interface 700 is communicatively coupled to the analyzer (cf. 652 in FIG. 6), hence belongs to the system (100 in FIG. 1) and is operated, preferably, by the process owners (managers).

Portion 710 is provided to show the process model, for example, by a graph similar to that was explained in FIGS. 2-3. The model can be given otherwise, for example, in a modeling language, in any other form that the user can understand.

Portion 720 is provided to receive one or more simulation targets from the user. Simplified, a target represents what the user is interested in.

For example, a first target may relate to the process to be simulated and seek to achieve short overall processing times (execution time of the process). In the patenting process example, this would mean to minimize the overall waiting time from sending the application (step 1) to completing the formalities (step 3) that lead to a patent. Parameters that relate to this target are, for example, parameter (a) (attorney time) or parameter (c) (waiting time). Parameters (e)(d) also contribute to the overall time.

For example, a second target could also relate to the process and seeks to optimize spending less resources as possible. Exemplary parameters are (a) (attorney time), and (e) (potential repetitions of step 2).

For example, a third target could be to optimize the sequence of process steps. Exemplary parameters are (d), (e) and (f).

For example, a fourth target could be to modify the probabilities to execute steps. The management of an enterprise (and hence the user) is likely interested in having a high probability to complete patenting processing by receiving patents, so parameter (f) (the grant rate) is important here.

For example, a fifth target could be related to the simulation itself, for example, to let the user indicate to run a rough simulation that returns results within seconds, or to run a more detailed simulation that needs some more time.

For example, sixth target could fine-tune the calculations of the indicators (or instructions). As it will be explained in connection with FIG. 10, the calculation uses decisions that partly depend on thresholds, so for example, the user could indicate a sensitivity values below 10 percent as being "not sensitive".

For example, a seventh target could be the optimization of categories. The user might de-select the category certainty to be displayed (in 730) so that he/she can concentrate on the more critical results.

The mentioned targets are just examples, and a persons of skill of the art may add further targets, as would be apparent. The targets can be chosen according to the experience of the users, e.g., some targets are likely more suitable for those with management experience, some targets are more appealing to experts in statistics.

In an example embodiment, the target can be selected by the user from drop-down lists, check boxes, or other user interface elements.

Two or more targets applied at the same time could lead to a conflicting situation. For example, speeding up the process (first target) likely requires extra resources that potentially collide with the second target. For example, to reduce the waiting times, the attorney might need more interaction with the patent office, thus binding more resources.

One target could relate to another, for example, the step execution probability of the last step (fourth) is indicative of the overall efficiency (second).

In a further example embodiment, target selection may be combined with input elements that receive values from the user. For example, one or more targets could be offered by a slider (721, as illustrated) and the user positions the slider to indicate if he/she puts more or less relevance to this target.

It is convenient, that the system connects the target selection with numerical values that are used in calculating the indicators (164, or instructions 163). For example, the target selection could be related with a sensitivity (detailed below, FIGS. 8-10).

Portion 730 shows the indicators, in the example, as stretched hexagons (almost rectangles) for the patenting process example. Conveniently, the indicators are presented separately for each parameter: indicator 731 for parameter (b)(fees), indicator 732 for parameter (a)(attorney time), indicator 733 for parameter (e) (repetition of step 2), and indicator 734 for parameter (d)(potential skip of step 2). In the example, the indicators could be color-coded or shade-coded for the category (e.g., white/empty for "certainty", yellow/shade for "assumptions", or—not illustrated—black for "uncertainty").

For convenience of explanation, it may be assumed that the user is interested in optimizing the patenting process for the first target, to have a short overall time. In the decision tree of analyzer 652 (cf. FIGS. 6/10) this will set the sensitivity accordingly (cf. FIG. 9). The indicators have therefore been calculated under consideration of the sensitivity. The presentation to the user reflects that.

The user looks at indicator 731, the underlying parameter (f) has the highest certainty (Fees do not vary. Fees are published by the patent offices.). Indicator 731 is short (horizontal dimension) because of the low relevance of fees in view of the overall time. The user does not have to worry about that parameter.

The user looks at indicator 732 for attorney time, the calculation are in the certainty category, but attorney time (a couple of days) is not relevant for the overall target (many months, or a couple of years).

The user looks at indicator 733, standing for the repetition of step 2 (parameter e), the category is "assumption" (coded ///) and the indicator is relevant (it is presented by a large symbol). Note that the indicator is also highlighted, in related to step 2, explanation below. The user can easily understand that the number of repetition(s) of step 2 has to be further investigated. Indeed, sending responses to office actions (in waiting for responses) takes time, a cycle of two responses can easily take up one year.

The user looks at indicator 734, standing for the grant rate, with "assumption" but less relevance. Indeed, partial performance of the process (e.g., ending the process at step 2) nevertheless bind resources, but that has less influence to the overall time.

It would be possible to group the indicators, for example, to show indicators that are applicable for some process steps (local indicators) in one area, and to show indicators that are applicable for essentially all process steps in a different area.

Persons of skill in the art understand that the form and presentation of the indicators (here rectangles, their arrangement vertically, and horizontal size) is not relevant for the invention. More in general, different aspects of indicators are presented graphically to the user, as in the following examples. Aspect (i) is the identification of the relevant parameter (in the example, labeling the indicator with the parameter). Aspect (ii) is the category (e.g., "certainty", in the example, color or shade coding). Aspect (iii) is the comparison with other indicators (in the example, given by the arrangement). Aspect (iv) is the relevance of indicators, indicators for less relevant parameters could be left out (cf. parameter (c) missing). Aspect (v) is the relevance of an indicator (e.g., indicated by the length of the on-screen symbol). Aspect (vi) is the relation of an indicator to process steps (to be explained below in connection with view 710).

As mentioned in connection with FIG. 6, optional model integration 660, the user-interface can be implemented such that when the user selects a process model component, the interface highlights a related indicator that is related to the component. Or, when the user selects an indicator, the interface highlights a related component. In the example of FIG. 7, the second step 712 is related to the third indicator 733, highlighting and selecting are illustrated by bold lines.

Optionally, portion 740 shows a data view, with values that are calculated from statistical calculation with data. The example shows a sensitivity value and a variance value. Managers (i.e. users) with background knowledge in statistics can perform the evaluation in view of such values. Other users, such as users who are not familiar with statistics, can disregard these values and rely more on the indicators in portion 730.

Sensitivity is a value referring to the influence of a parameter to overall simulation (of the process as a whole). Variance refers to the distribution of statistical dispersion of a measurement values (i.e., data). Sensitivity and variance are just examples that illustrate that well-know statistical approaches can be applied to evaluate data. Persons of skill in the art can use different approaches and implement the invention with different values.

In other words, user-interface 700 is an interface for a computer that is adapted to simulate processes. User interface has a first portion 710 to visualize the process model (101) to be simulated with parameters, a second portion 720 to receive a target for simulation, and a third portion 730 to visualize indicators for a certainty of using the parameters in a simulation according to the selected target.

The indicators in the third portion 730 are visually related to components of the process model in the first section 710, in example of FIG. 7 by highlighting indicator 733 that is related to step 712. The indicators in the third portion 730 can be selectable for the user in categories, so that process components (e.g., steps) and parameters that fit to that category can be visualized in the other portions.

The detailed description now looks inside the simulator and the analyzer and gives examples, how the certainty level indicators can be calculated. The description will refer to statistical approaches such as sensitivity and variance as placeholders for any other approaches to extract statistical values (or figures) from data.

Figure 8:
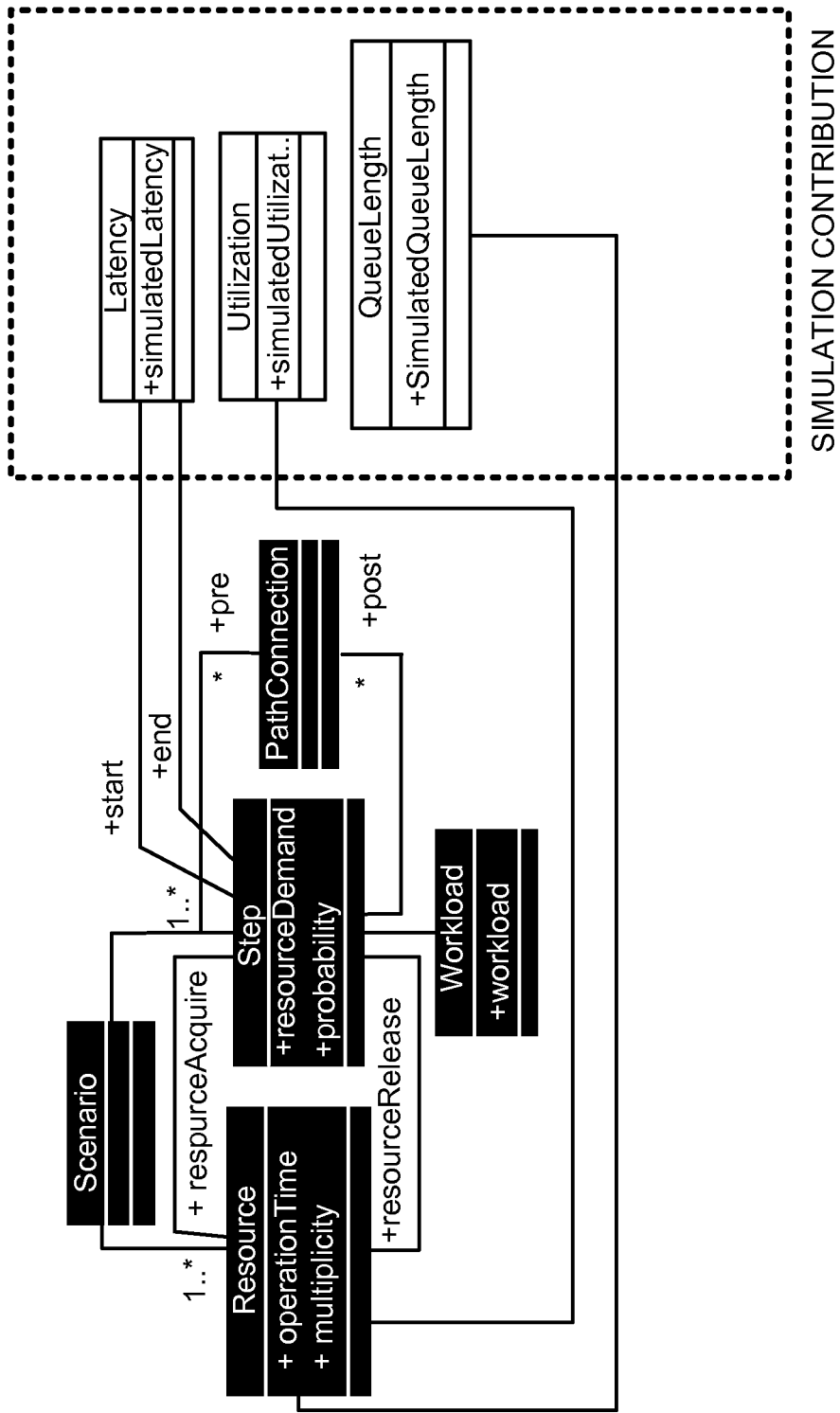
FIG. 8 is a process diagram explaining resources of one process step.

FIG. 8 is a process diagram explaining how resources for processes are acquired during simulation. The figure is in principle applicable for all steps.

The step (illustrated in the center) demands resources (illustrated on the left). Different steps can access the same resource, for example, steps 1, 2, and 3 use attorney time.

Figure 9:
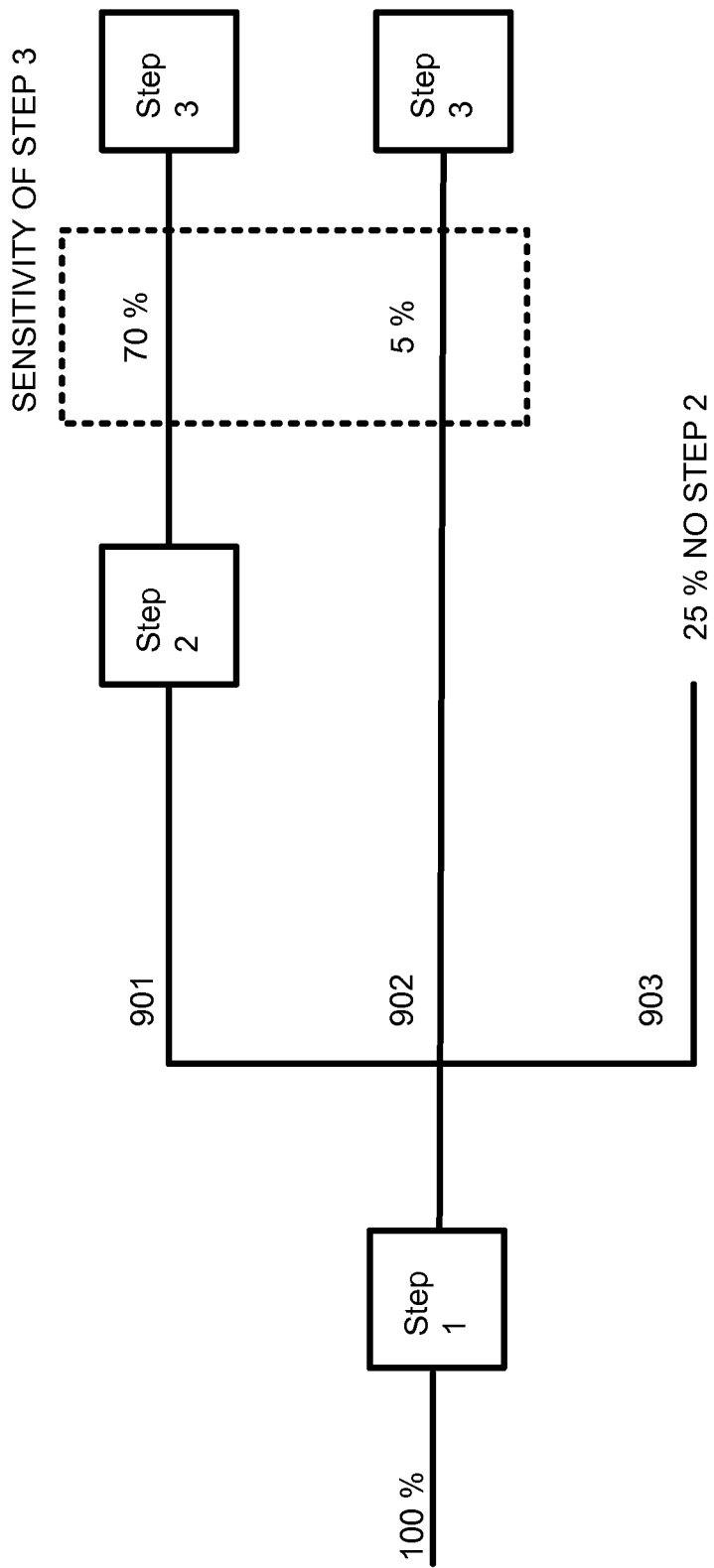
FIG. 9 is a simplified process diagram to illustrate sensitivity.

Resource.multiplicity indicates how many resource units are available, for example, how many persons could perform the step (for example, step 1, the attorney sending an application), in the context of the example, how many attorneys in an enterprise are available to handle patent applications. The multiplicity information relates to Data Amount and is therefore a figure that goes into a calculation (cf. FIG. 10). Resource.operationTime indicates, for example, how much time is available for each attorney. Step.resourceDemand indicates, for example, the time one attorney needs for one step (e.g. 5 to 20 days for step 1), in other words, this indicates the resource demand to execute the step once. Repetitions of the step would demand more resources. Step.resource Probability indicates the probability that the step is actually executed, for example, for step 3 that corresponds to the grant rate. FIG. 9 will give further discussion. In general, though, the probability indicates the probability that a step is reached from one of its previous steps, for example, step 3 depends on step 2 by the grant rate (cf. parameter f in FIG. 3).

As given within the dashed frame, intermediate results in simulation are, for example (i) latency, the time between steps, (ii) utilization, an indication how many resources are consumed by the step, and (iii) Queue Length, an indication of accumulated not-yet-performed steps in this exemplary discrete event simulation.

As mentioned, well-know statistical approaches can be applied to evaluate data. The example embodiment(s) may use exemplary approaches such as data amount, variance, a distribution function, sensitivity.

More in detail, data amounts are taken into account to differentiate performance parameters that are calculated from insufficient amount of process data 102. For example, the parameter (f) grant rate is usually based on all applications filed to the patent office, and despite the parameter (f) is only one figure (e.g., 75 percent), the parameter is based on a sufficient data amount. Parameter (a) indicates the resources needed to perform steps (attorney working days per step) and is potentially more critical because sufficient data might not yet be available for each enterprise.

More in detail, the distribution function is an example for using well-known statistical approaches to describe data by mathematical functions. Libraries can be used to parse a given data set and to determine if data matches to a function, for example to a Gaussian distribution function or to a continuous uniform distribution.

More in detail, sensitivity values differentiate sensitive parameters from non-sensitive parameters. Sensitivity takes the behavior and probabilities of process steps into account and measures how often a process step is executed compared to others. For example, a step performance importance (STI) value can be calculated for each process step as the sum of the probabilities of all paths leading to this step.

FIG. 9 is a simplified process diagram with annotated probabilities to illustrate sensitivity. In the exemplary process 900 (cf. FIG. 2-3), step 1 (sending application) is always performed and therefore has the probability 1 (or 100 percent). After performing step 1, different paths can be distinguished.

Path 901 is the path with step 2 (sending response) being performed at least once. Path 901 leads to step 3 (completing formalities) with a probability of, for example, 0.7 (or 70 percent).

Path 902 is the path with step 2 not performed (skipped or bypassed) but directly leading to step 3 (cf. parameter d). Path 902 stands for a favorable feedback from the patent office (so-called first office action allowance) so that only the formalities need to be completed. Compared to path 901, path 902 is rather an exception so that the probability can be assumed to be 0.05 (or 5 percent).

Path 903 does not lead to step 2 and therefore not to step 3, when the feedback from the patent office does not justify sending a response (step 2). The probability of path 903 is the complement to that of paths 901 and 903 and is, for example, 0.25 (or 25 percent).

The sensitivity of step 3 can be calculated as the sum of the probabilities of the paths that lead to step 3. In the example, 70 percent of path 901 plus 5 percent of path 902 result to 75 percent (that is actually the grant rate).

Also, sensitivities for step 2 can be calculated as well. There is, for example, a probability that step 2 is not executed (paths 902 and 903).

The sensitivity can be displayed to the experienced user, for example, in data view 740 (FIG. 7), or as it will be illustrated in the analyzer to derive the indicators and instructions.

In connection with simulation targets (cf. FIG. 7/720), sensitivity can be considered as sensitive or not sensitive. For example, while step 3 has a probability of 75 percent, it is sensitive, but step 2 being skipped (path 902) can be considered as not sensitive (as being below an arbitrary threshold of 10 percent).

Figure 10:
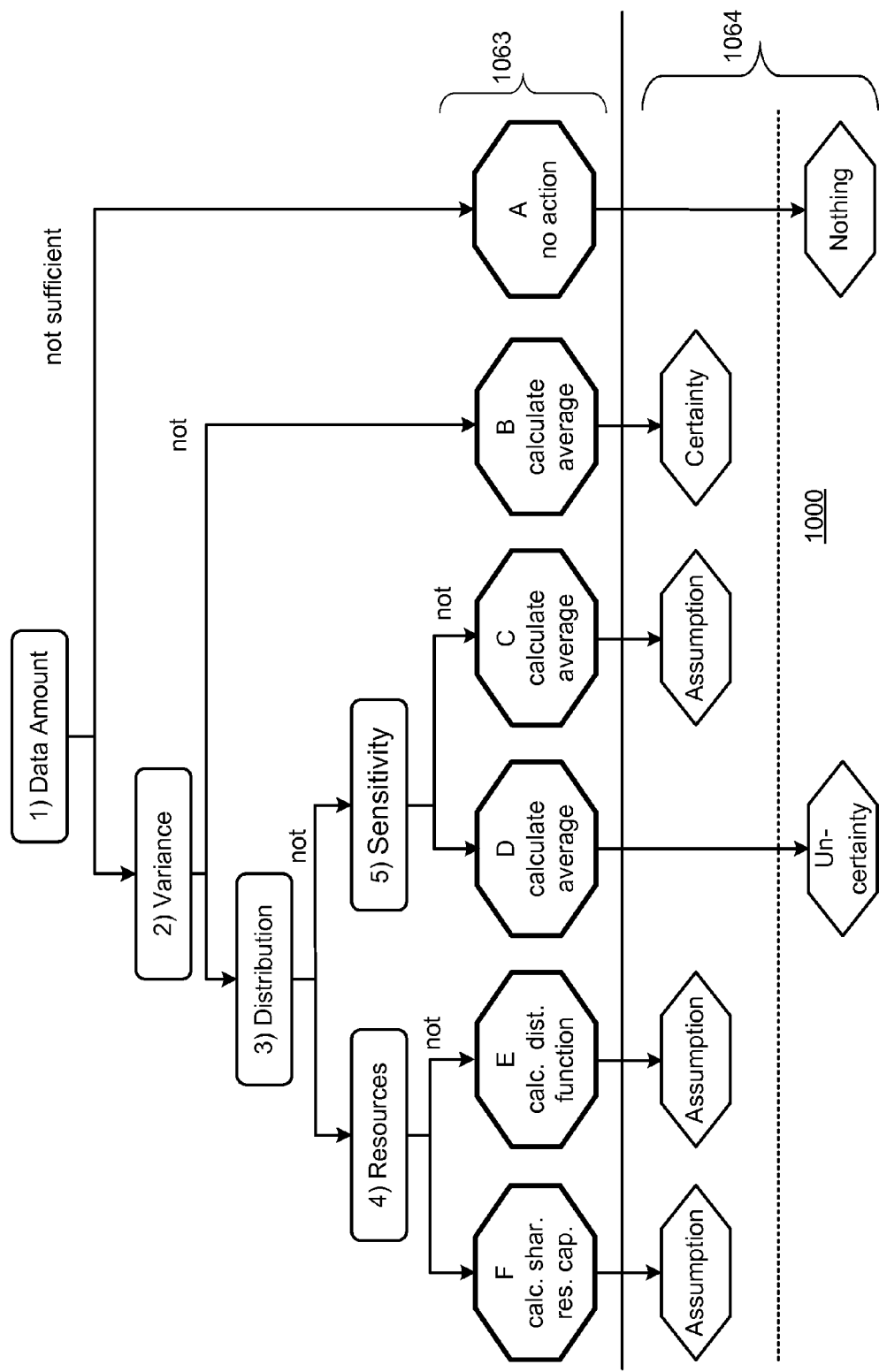
FIG. 10 shows a decision tree with binary decisions that in an example embodiment is part of the analyzer.

FIG. 10 shows decision tree 1000 with binary decisions that in an example embodiment is part of the analyzer. The decisions are logically related so that the outcome of a decision selects the decision to make next. The exemplary decision tree is applicable for simulations of business processes. The figure illustrates the decisions with round-cornered rectangles, labels 1) to 5).

Decisions are: 1) Data Amount Decision, deciding if the amount of input data is sufficient to perform simulation (shown left) or not sufficient (shown right). 2) Variance Decision, deciding if the variance of the input data exceeds a threshold (high variance, left) or not (low variance, right). 3) Distribution Function Decision, deciding if a the input data can be described in a distribution function (function known, left) or not (function not known, right). 4) Shared Resource Decision, deciding if a resource in shared between different scenarios (shared, left) or not shared (right). 5) Sensitivity Decision, deciding if a parameter and/or a process component is (sensitive, left) or not (not sensitive, right)

Depending on the decisions, the flow determines instructions 1063 (octagons, labeled with upper-case letters A to F) or indicators 1064 to the user interface (hexagons, same letters apply).

In the example, the decision flow is as follows: 1) Data Amount Decision, in case the input data is sufficient, the flow continues with 2) the Variance Decision, otherwise the flow is cancelled: no simulation or action is possible (box A). Specifically, 2) Variance Decision, in case the variance is low, an average of the input data can be calculated with certainty (box B), otherwise the flow continues with 3) the distribution function decision. 3) Distribution Function Decision, in case the distribution function is known, the flow continues at 4) Shared Resources Decision, or at 5) Sensitivity Decision. The Distribution Function Decision does not trigger any instruction nor indicator.

Thus, at 4) Shared Resource Decision, in case a resource is shared, the capacity of the shared resource can be calculated (instruction 1063 box F), and the assumption that a shared resource is considered is communicated to the user. In case the resource is not shared, the distribution function can be calculated (instruction 1063, box E) and the user informed accordingly. In 5) Sensitivity Decision, in both cases, the average of the input data can be calculated (instruction 1063, boxes C and D), but to the user it is indicated that the distribution is uncertain (if sensitive, box D) or if an insensitive parameter needs to be assumed (if insensitive, box C).

As illustrated by the dotted lines, the indicators 1064 (to the user) fall into classes: Uncertainty (including non-availability of result box A "Nothing"), Assumption (C, E, F), and Certainty (B).

As mentioned above (FIG. 7), these 3 classes can be visualized (for example by color code, or shade code). The horizontal dashed line inside the hexagons illustrate that 4 indicators (B, C, E, F) encourage to the user to continue the simulation, and that 2 indicators (A, D) do not.

Figure 11:
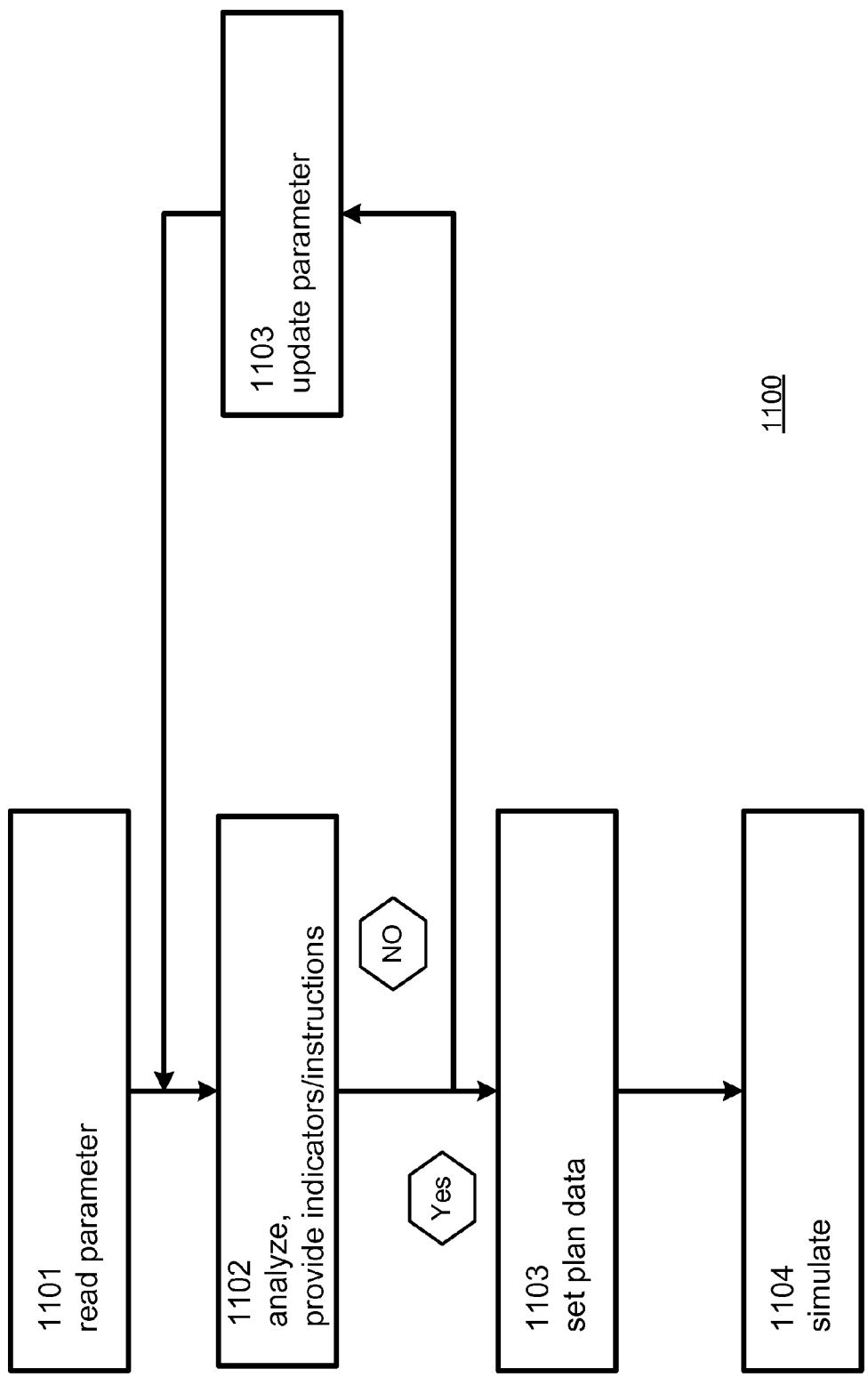
FIG. 11 is an exemplary usage scenario for using an example embodiment.

FIG. 11 illustrates an exemplary usage scenario 1100 for using an embodiment of the present invention. It will be described by referring to system 100 with user interface 700 and the manager user (FIGS. 1, 7) and by referring to the exemplary patenting process.

In action 1101, system 100 receives the model together with parameters and data that is available. For example, the user uploads a computer file with the 3-step process model that was configured earlier (cf. 410 in FIG. 4). Initial data is uploaded with parameters, for example (a) 10 days for step 1, and (d)(e)(f) assuming all steps to be performed one time (cf. description of FIG. 4).

In action 1102, system 100 then interacts with the user to receive a simulation target, for example the first target to optimize short overall processing, and provides the indicators (cf. FIG. 7, hexagon symbols).

The user's attention is now directed to, for example, to indicator 733, pointing out that the repetition of steps is important. The user decides to fine tune the parameters, to upload further data with more realistic parameters, for example, a data describing that step 2 is usually repeated. This action 1103 triggers the system to analyze again (1102).

As in action 1103, the system receives data to actually perform the process, so-called plan data, for example to calculate overall time for 100 patent applications in a given time frame.

As in action 1104, the system now simulates the process.

In other words, in an easy to understand user interface, system 100 presented the user a potential risk that the simulation might fail due incorrect parameter settings. Thereby the system assisted the user to correction the parameter settings.

Figure 12:
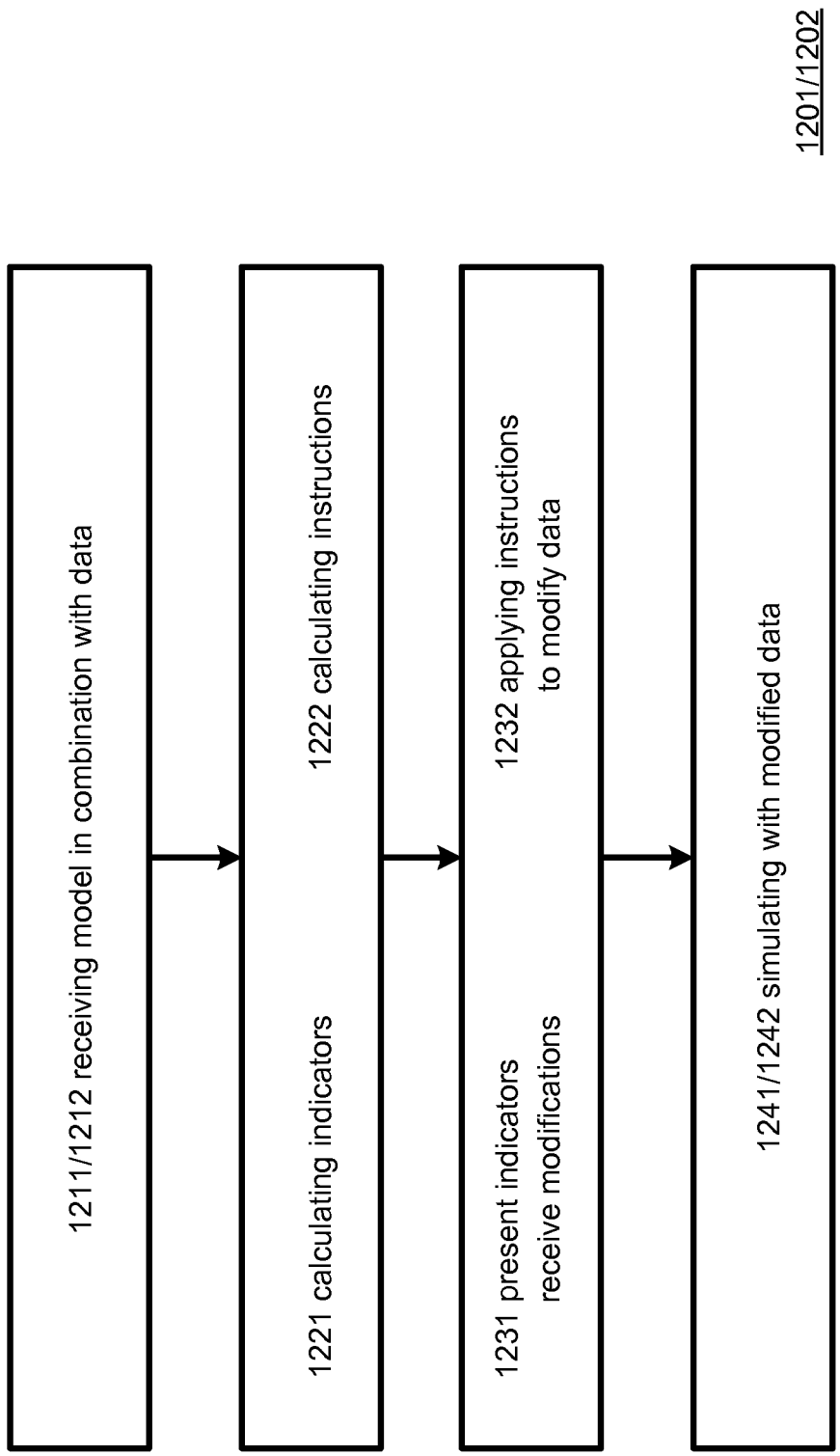
FIG. 12 is a flow chart for a method and for actions caused by a data processing apparatus to be performed.

FIG. 12 is a flow chart for method 1201 of an example embodiment, with operations 1211/1212, 1221/1222, 1231/1232, 1241/1242. The references also may represent components of a computer program product that is tangibly embodied on computer-readable media. The computer program product is configured to cause a data processing apparatus to perform that method 1200. The data processing apparatus is related to the part of the computer system that was introduced as analyzer 652.

As mentioned in connection with FIG. 1, the evaluation results are presented to users by indicators in the first embodiment, and evaluation results are computer-readable instructions in the second embodiment. Hence there are at least two variants of method 1201/1202. The description starts with the variant applicable for a first embodiment:

In receiving 1211, a model 101 of a process 200/300 is received with process parameters (for example a, b, c, ... f) in combination with performance data 102. Performance data can be from previous executions of process 200/300, or can be initial data (e.g, set by the user).

In calculating 1221, certainty level indicators 664 are calculated. The indicators represent the influence of the parameters to the simulation.

In presenting/receiving 1231, the indicators 664 are presented to a user and modifications to the performance data are received from the user.

In simulating 1241, the execution of the process is simulated with modified performance data.

As mentioned, the indicators (664) are preferably calculated for parameters that relate to process resources (a, b).

As explained in connection with FIG. 7, optionally, user input is solicited for a selection of a simulation target and for calculating the indicators (664) according to the selection. The selection of the simulation target is, for example, execution time of the process, sequence of process steps, and step execution probabilities. As explained, for example, in connection with FIG. 10, the indicators can be calculated in categories, that are, for example, the categories "certainty", "assumption" and "uncertainty".

As explained, for example, in connection with FIG. 7, a user interface is provided to receive a selection of an indicator category from the user (view 730, highlighted 733) and visualize in the model the parameter for that the selected indicator category is related (view 710, highlighted step 712).

The description continues with the method variant that is applicable for the second embodiment: In receiving 1212, a model 101 of a process 200/300 with process parameters (a, b, c, ... f) in combination with performance data 102 (e.g., from previous executions of the process 200/300). In calculating 1222, instructions 163 are calculated that represent the influence of the parameters to the simulation. In applying 1232, the instructions 163 are used to modify the performance data. In simulating 1242, the execution of the process is simulated with modified performance data 102. Optionally, the instructions 663 are calculated for parameters that relate to process resources (a, b).

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on data and generating output. Method steps also may be performed by, and an apparatus may be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto optical disks, or optical disks. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A computer program product, tangibly embodied on a non-transitory computer-readable medium, the computer program product being configured to cause a data processing apparatus to:
   receive a model of a process characterized by steps and a plurality of process parameters;
   receive performance data related to execution of the process and resources required by the process for execution;
   receive a selection of a simulation target;
   generate a simulation of the process such that the model of the process is simulated according to the simulation target using the performance data and the resources as input to the process parameters;
   calculate an influence of a respective process parameter of the plurality of process parameters to the simulation target;
   calculate one of the following categories of a certainty level indicator for each process parameter of the plurality of process parameters:
      a first category for the certainty level indicator by determining that a variance of the respective process parameter is below a threshold value,
      a second category for the certainty level indicator by determining that the variance of the respective process parameter is above the threshold value, and determining that the respective process parameter matches a known distribution function from a database storing known distribution functions, or
      a third category for the certainty level indicator by determining that the variance of the respective process parameter is above the threshold value, determining that the respective process parameter does not match a known distribution function from the database storing the known distribution functions, and determining that the respective process parameter is sensitive;
   present the calculated first, second, or third category of the certainty level indicator for each respective process parameter to a user in a manner that indicates the calculated influence of the respective process parameter to the simulation target;
   receive modifications to the performance data associated with at least one of the plurality of process parameters; and
   simulate the execution of the process based on the modifications to the performance data.

2. The computer program product of claim 1, wherein the second category for the certainty level indicator is alternatively calculated by determining that the variance of the respective process parameter is above the threshold value, determining that the respective process parameter does not match a known distribution function from the database storing the known distribution functions, and determining that the respective process parameter is not sensitive.

3. The computer program product of claim 1, wherein the first category for the certainty level indicator is certainty, the second category for the certainty level indicator is assumption, and the third category for the certainty level indicator is un-certainty.

4. The computer program product of claim 1, wherein the computer program product is configured to cause the data processing apparatus to:
   provide a user interface that receives a selection of the first, second, or third category for the certainty level indicator from the user; and
   provide a visualization in the model that highlights a portion of the model relating to the at least one process parameter corresponding to the selection of one of the categories of certainty level indicators.

5. The computer program product of claim 1, wherein the computer program product is configured to cause the data processing apparatus to:
   calculate one or more computer-readable instructions;
   automatically trigger modifications to the performance data associated with at least one of the plurality of process parameters; and
   simulate the execution of the process with automatically triggered modified performance data.

6. The computer program product of claim 1, wherein the selection of the target simulation includes at least one of an execution time of the process, sequence of process steps, and step execution probabilities.

7. A method for determining process parameter certainty in a model of a process, the method being performed by at least one processor, the method comprising:
   receiving a model of a process characterized by steps and a plurality of process parameters;

receiving performance data related to execution of the process and resources required by the process for execution;

receiving a selection of a simulation target;

generating, by the at least one processor, a simulation of the process such that the model of the process is simulated according to the simulation target using the performance data and the resources as input to the process parameters;

calculating an influence of a respective process parameter of the plurality of process parameters to the simulation target;

calculating, by the at least one processor, one of the following categories of a certainty level indicator for each process parameter of the plurality of process parameters:
  a first category for the certainty level indicator by determining that a variance of the respective process parameter is below a threshold value,
  a second category for the certainty level indicator by determining that the variance of the respective process parameter is above the threshold value, and determining that the respective process parameter matches a known distribution function from a database storing known distribution functions, or
  a third category for the certainty level indicator by determining that the variance of the respective process parameter is above the threshold value, determining that the respective process parameter does not match a known distribution function from the database storing the known distribution functions, and determining that the respective process parameter is sensitive;

presenting the calculated first, second, or third category of the certainty level indicator for each respective process parameter to a user in a manner that indicates the calculated influence of the respective process parameter to the simulation target;

receiving modifications to the performance data associated with at least one of the plurality of process parameters; and simulating, by the at least one processor, the execution of the process based on the modifications to the performance data.

8. The method of claim 7, wherein the second category for the certainty level indicator is alternatively calculated by determining that the variance of the respective process parameter is above the threshold value, determining that the respective process parameter does not match a known distribution function from the database storing the known distribution functions, and determining that the respective process parameter is not sensitive.

9. The method of claim 7, wherein the first category for the certainty level indicator is certainty, the second category for the certainty level indicator is assumption, and the third category for the certainty level indicator is un-certainty.

10. The method of claim 7, further comprising:
providing a user interface that receives a selection of the first, second, or third category for the certainty level indicator from the user; and
providing a visualization in the model highlighting a portion of the model relating to the at least one process parameter corresponding to the selection of one of the categories of certainty level indicators.

11. The method of claim 7, further comprising:
calculating one or more computer-readable instructions;
automatically triggering modifications to the performance data associated with at least one of the plurality of process parameters; and
simulating the execution of the process with automatically triggered modified performance data.

12. The method of claim 7, wherein the selection of the target simulation includes at least one of an execution time of the process, sequence of process steps, and step execution probabilities.

13. A system for determining process parameter certainty in a model of a process, the system comprising:
at least one processor;
a non-transitory computer-readable medium including executable code that when executed by the at least one processor is configured to implement an analyzer,
the analyzer configured to receive a model of a process characterized by steps and a plurality of process parameters and receive performance data related to execution of the process and resources required by the process for execution,
the analyzer configured to receive a selection of a simulation target,
the analyzer configured to generate a simulation of the process such that the model of the process is simulated according to the simulation target using the performance data and the resources as input to the process parameters;
the analyzer configured to calculate an influence of a respective process parameter of the plurality of process parameters to the simulation target, and calculate one of the following categories of a certainty level indicator for each process parameter of the plurality of process parameters:
  a first category for the certainty level indicator by determining that a variance of the respective process parameter is below a threshold value,
  a second category for the certainty level indicator by determining that the variance of the respective process parameter is above the threshold value, and determining that the respective process parameter matches a known distribution function from a database storing known distribution functions, or
  a third category for the certainty level indicator by determining that the variance of the respective process parameter is above the threshold value, determining that the respective process parameter does not match a known distribution function from the database storing the known distribution functions, and determining that the respective process parameter is sensitive,
the analyzer configured to present the calculated first, second, or third category of the certainty level indicator for each respective process parameter to a user in a manner that indicates the calculated influence of the respective process parameter to the simulation target,
the analyzer configured to receive modifications to the performance data associated with at least one process parameter of the plurality of process parameters and simulate the execution of the process based on the modifications to the performance data.

14. The system of claim 13, wherein the analyzer alternatively calculates the second category for the certainty level indicator by determining that the variance of the respective process parameter is above the threshold value, determining that the respective process parameter does not match a known distribution function from the database storing the known distribution functions, and determining that the respective process parameter is not sensitive.

15. The system of claim 13, wherein the first category for the certainty level indicator is certainty, the second category for the certainty level indicator is assumption, and the third category for the certainty level indicator is un-certainty.

16. The system of claim 13, wherein the analyzer is also configured to provide a user interface that receives a selection of the first, second, or third category for the certainty level indicator from the user, and provide a visualization in the model highlighting a portion of the model relating to the at least one process parameter corresponding to the selection of one of the categories of certainty level indicators.

17. The system of claim 13, wherein the analyzer is also configured to calculate one or more computer-readable instructions;
   automatically trigger modifications to the performance data associated with at least one of the plurality of process parameters; and
   simulate the execution of the process with automatically triggered modified performance data.

18. The system of claim 13, wherein the selection of the target simulation includes at least one of an execution time of the process, sequence of process steps, and step execution probabilities.

* * * * *